(12) United States Patent
Baesjou et al.

(10) Patent No.: US 10,340,427 B2
(45) Date of Patent: *Jul. 2, 2019

(54) QUANTUM DOTS WITH INORGANIC LIGANDS IN AN INORGANIC MATRIX

(71) Applicant: Lumileds LLC, San Jose, CA (US)

(72) Inventors: Patrick John Baesjou, Eindhoven (NL); Stefan Willi Julius Gruhlke, Baesweiler (NL); Roelof Koole, Eindhoven (NL); Johannes Franciscus Maria Cillessen, Deurne (NL)

(73) Assignee: Lumileds LLC, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/114,320

(22) PCT Filed: Jan. 29, 2015

(86) PCT No.: PCT/EP2015/051746
§ 371 (c)(1),
(2) Date: Jul. 26, 2016

(87) PCT Pub. No.: WO2015/117876
PCT Pub. Date: Aug. 13, 2015

(65) Prior Publication Data
US 2017/0012180 A1    Jan. 12, 2017

(30) Foreign Application Priority Data

Feb. 4, 2014  (EP) ..................... 14153828

(51) Int. Cl.
*H01L 33/50*    (2010.01)
*B82Y 40/00*    (2011.01)
(Continued)

(52) U.S. Cl.
CPC ............ *H01L 33/502* (2013.01); *C09K 11/02* (2013.01); *C09K 11/025* (2013.01);
(Continued)

(58) Field of Classification Search
CPC .................. H01L 33/502; H01L 33/56; H01L 2933/0083; H01L 33/50; C09K 11/02;
(Continued)

(56) References Cited

U.S. PATENT DOCUMENTS 4,287,257 A    9/1981 Ohmatoi et al.
7,160,613 B2   1/2007 Bawendi et al.
(Continued)

FOREIGN PATENT DOCUMENTS

CN    103055954 A    4/2013
JP    S5541649 A     3/1980
(Continued)

OTHER PUBLICATIONS

EPO as ISA, International Search Report and Written Opinion dated Apr. 8, 2015 from International Application No. PCT/EP2015/051746, filed Jan. 29, 2015, 8 pages.
(Continued)

*Primary Examiner* — Duy T Nguyen

(57) ABSTRACT

The invention provides a luminescent material (10) based on quantum dots (100), wherein the quantum dots (100) have inorganic capping agents (110), wherein the luminescent material (10) comprises particles (12) having an inorganic salt matrix (14) hosting the quantum dots (100) with inorganic capping agents (110), wherein the luminescent quantum dots (100) have an outer layer (105). The invention also provides a method for the production of such luminescent material (10). The new luminescent material can be used and processed as conventional particulate luminescent material.

11 Claims, 4 Drawing Sheets

(51) Int. Cl.
*B82Y 20/00* (2011.01)
*H01L 33/00* (2010.01)
*C09K 11/02* (2006.01)
*C09K 11/56* (2006.01)
*C09K 11/88* (2006.01)

(52) U.S. Cl.
CPC .......... *C09K 11/565* (2013.01); *C09K 11/883* (2013.01); *B82Y 20/00* (2013.01); *B82Y 40/00* (2013.01); *H01L 33/50* (2013.01); *Y10S 977/774* (2013.01); *Y10S 977/896* (2013.01); *Y10S 977/95* (2013.01)

(58) Field of Classification Search
CPC ... C09K 11/565; C09K 11/883; C09K 11/025; B82Y 20/00; B82Y 40/00; Y10S 977/774; Y10S 977/825; Y10S 977/892; Y10S 977/95; Y10S 977/896
USPC .......................................................... 257/98
See application file for complete search history.

(56) References Cited

U.S. PATENT DOCUMENTS

| | | | |
|---|---|---|---|
| 9,034,978 B2* | 5/2015 | Thalappil | B82Y 20/00 252/301.36 |
| 9,365,701 B2 | 6/2016 | Nick et al. | |
| 9,385,194 B2 | 7/2016 | Cho et al. | |
| 9,412,916 B2* | 8/2016 | Xu | C09K 11/02 |
| 2011/0260109 A1* | 10/2011 | Shih | B82Y 5/00 252/301.16 |
| 2012/0032122 A1 | 2/2012 | Zong et al. | |
| 2012/0104325 A1 | 5/2012 | Talapin et al. | |
| 2012/0261651 A1* | 10/2012 | Noto | C09K 11/06 257/40 |
| 2014/0256532 A1 | 9/2014 | Landry et al. | |
| 2014/0326949 A1* | 11/2014 | Xu | C09K 11/02 257/13 |
| 2014/0346442 A1* | 11/2014 | Nag | H01L 29/0665 257/29 |
| 2015/0217374 A1* | 8/2015 | Kim | B22F 9/24 420/501 |
| 2017/0012180 A1 | 1/2017 | Baesjou et al. | |
| 2017/0029693 A1* | 2/2017 | Gruhlke | C09K 11/025 |

FOREIGN PATENT DOCUMENTS

| | | |
|---|---|---|
| JP | H02308892 A | 12/1990 |
| JP | 2013089969 A | 5/2013 |
| WO | 2009035657 A1 | 3/2009 |
| WO | 2010014198 A1 | 2/2010 |
| WO | 2011031871 A1 | 3/2011 |
| WO | 2012035109 A1 | 3/2012 |
| WO | 2012104325 A1 | 8/2012 |
| WO | 2012158847 A2 | 11/2012 |
| WO | 2013057702 A1 | 4/2013 |
| WO | 2013114308 A1 | 8/2013 |

OTHER PUBLICATIONS

Extended European Search report dated Jun. 25, 2014, European Application No. 14153828.0, 5 pages.
Kovalenko, et al. "Expanding the Chemical Versatility of Colloidal Nanocrystals Capped with Molecular Metal Chalcogenide Ligands", J. Am. Chem. Soc., 2010, 132 (29), pp. 10085-10092.
Koole, et al. "On the Incorporation Mechanism of Hydrophobic Quantum Dots in Silica Spheres by a Reverse Microemulsion Method", Chem. Mater., 2008, 20(7), pp. 20503-2512.
Extended European Search Report dated Nov. 3, 2014, European Application No. 14176692.3, 8 pages.
Yu Ke, et al. "Recent Patents on Quantum Dot Engineering for Biomedical Application", Recent Patents on Biomedical Engineering, vol. 5, No. 3, Nov. 1, 2012, pp. 223-234.
Prinsa Verma, et al. "Capped semiconductor nanocrystals for device applications", Optics Communications 284 (2011), pp. 881-884.
EPO as ISA, International Search Report and Written Opinion dated Apr. 30, 2015 from International Application No. PCT/EP2015/051460, filed Jan. 26, 2015, 12 pages.
Article 94(3) EPC dated Feb. 12, 2018, European Application No. 15702690.7, 7 pages.
Angshuman, et al., Metal-free Inorganic Ligands for Colloidal Nanocrystals: S2—, HS—, Se2—, HSe—, Te2—, HTe—, TeS32—, OH—, and NH2— as Surface Ligands, Journal of the American Chemical Society, 2011, 133 (27), pp. 10612-10620.
First Office Action dated Mar. 19, 2018, Chinese Patent Application No. 201580007256.8, 15 pages.
Otto, et al., "Colloidal Nanocrystals Embedded in Macrocrystals: Robustness, Photostability, and Color Purity", American Chemical Society Publications/Nano Letters, 2012, 12, pp. 5348-5354.
Article 94(3) EPC dated Feb. 12, 2018, European Patent Application No. 15702690.7, 7 pages.
First Office Action dated Feb. 27, 2018, China Application No. 201580007246.4, 13 pages.
CN Second Office Action dated Nov. 13, 2018, China Patent Application No. 201580007246.4, 16 pages.
CN Second Office Action dated Nov. 20. 2018, China Patent Application No. 201580007256.8, 10 pages.
EP Communication dated Nov. 29, 2018, European Patent Application No. 15702690.7, 5 pages.
JP Office Action dated Oct. 9, 2018, Japan Application No. 2016-549483, 4 pages.

* cited by examiner

QUANTUM DOTS WITH INORGANIC LIGANDS IN AN INORGANIC MATRIX

CROSS-REFERENCE TO RELATED APPLICATIONS

The present application is a §371 application of International Application No. PCT/EP2015/051746 filed on Jan. 29, 2015 and entitled "QUANTUM DOTS WITH INORGANIC LIGANDS IN AN INORGANIC MATRIX," which claims priority to European Patent Application No. 14153828.0, filed Feb. 4, 2014. Both PCT/EP2015/051746 and EP14153828.0 are incorporated herein.

FIELD OF THE INVENTION

The invention relates to a method for the production of a (particulate) luminescent material as well as to such (particulate) luminescent material per se. Further, the invention relates to a lighting device including such (particulate) luminescent material.

BACKGROUND OF THE INVENTION

The synthesis of quantum dots is known in the art. US2012104325, for instance, describes an isolable colloidal particle comprising a nanoparticle and an inorganic capping agent bound to the surface of the nanoparticle, a solution of the same, a method for making the same from a biphasic solvent mixture, and the formation of structures and solids from the isolable colloidal particle. The process can yield photovoltaic cells, piezoelectric crystals, thermoelectric layers, optoelectronic layers, light emitting diodes, ferroelectric layers, thin film transistors, floating gate memory devices, imaging devices, phase change layers, and sensor devices. Especially, this document describes an isolable colloidal particle comprising an inorganic capping agent bound to a surface of a nanoparticle and substantially free of an organic capping agent. Further, this document describes a solution of such colloidal particle comprising a solvent and the inorganic capping agent bound to a surface of a nanoparticle, wherein the solution is substantially free of an organic capping agent.

WO2013057702 describes a luminescent nano particles based luminescent material comprising a matrix of interconnected coated luminescent nano particles, wherein for instance wherein the luminescent nano particles comprise CdSe, wherein the luminescent nano particles comprise a coating of CdS and wherein the matrix comprises a coating comprising ZnS. The luminescent material according may have a quantum efficiency of at least 80% at 25° C., and having a quench of quantum efficiency of at maximum 20% at 100° C. compared to the quantum efficiency at 25° C.

WO2012035109 describes mixed crystals made of semiconductor materials from the elements of groups 12 & 15, 12 & 16, 13 & 15 and/or 14 & 16 of the periodic table of the elements in a protective matrix, to a method for producing same, and to the uses thereof in various materials, for example in fluorescent tubes, in laser technology or as packaging material for nanoparticles. The semiconductor particles have an average size between 1 and 100 nm and the content thereof in the mixed crystal is 10-9-10%.

SUMMARY OF THE INVENTION

Quantum dots (qdots or QDs) are currently being studied as phosphors in solid state lighting (SSL) applications (LEDs). They have several advantages such as a tunable emission and a narrow emission band which can help to significantly increase the efficacy of LED based lamps, especially at high CRI. Typically, qdots are supplied in an organic liquid, with the quantum dots surrounded by organic ligands, such as oleate (the anion of oleic acid), which helps to improve the emission efficiency of the dots as well as stabilize them in organic media. Such organic media often includes polymer matrices, such as acrylates.

While being a convenient arrangement, such polymer matrices are found to be instable (browning) against prolonged exposure to LED conditions, and the same holds true for the quantum dots. It is known in general that organic materials tend be unstable in the long term against high temperature (e.g. between 50-150° C.) or high (blue) light flux (e.g. between 1 and 100 W/cm$^2$), or a combination thereof, such as typically found in an LED lamp. In that sense, the interface between the organic ligands and the qdots is also suspected to be a source of instabilities. Finally, qdots themselves suffer from long-term instabilities under such conditions which are found to be related (at least partly) to moisture (water) and/or oxygen.

Hence, the long-term instabilities of a qdot/matrix composite as related to prevailing LED condition (high temperature and light flux), as well as the qdot sensitivity to moisture, are all hampering the use of qdot phosphors in LEDs applications.

Therefore, there is a drive towards using materials that are more stable against the conditions prevailing in LED lamps, as well materials or geometries that shield the qdots from water and/or oxygen. Ideally, this could all be combined in one material that would also be compatible with the qdots.

Hence, it is an aspect of the invention to provide an alternative (particulate, especially micro particulate) luminescent material and/or an alternative method for the production of such (particulate) luminescent material, which preferably further at least partly obviate one or more of above-described drawbacks. It is further an aspect of the invention to provide an alternative lighting device including such luminescent material, which has stable optical properties. It is further an aspect of the invention to provide an alternative wavelength converter element including such luminescent material and/or an alternative lighting device including such wavelength converter element.

Herein, amongst others the replacement of the organic ligands with inorganic ones is described, which further serve as a scaffold for growing a fully inorganic matrix by a simple precipitation mechanism. This combination will ensure that the quantum dots are in a fully inorganic environment where the matrix can also serve as a barrier against water and/or air, helping with the long term stability of the qdots (under LED conditions) without the need for further sealing at the die or component level.

Instead of the term "ligand" also the terms "capping agent" or "capping ligand" or "coordinating ligand" are applied herein. As indicated above, the organic capping agent may be applied to stabilize the QD in an organic solvent. The term "capping agent" may also refer to a plurality of different capping agents. The herein described capping agents are especially ionic agents. Examples thereof are so-called Zintl ions (see also below). Positively charged capping agents may coordinate to anions, such as the S ion or the Se ion, in an outer layer of the quantum dots, and negatively charged capping agents may coordinate to cations, such as Zn cation or Cd cation, in an outer layer of the quantum dots.

In a first aspect, the invention provides a method for the production of a (particulate) luminescent material based on quantum dots, the method comprising:

(i) providing luminescent quantum dots with an inorganic capping agent in a starting liquid;

(ii) precipitating in a co-precipitation process an inorganic salt comprising precipitated material from the starting liquid;

(iii) separating in a separation process the precipitated material from the starting liquid and providing said (particulate) luminescent material.

It appears that with the present method stable luminescent material can be provided. For instance, (co-precipitation) salts can be chosen that co-precipitate in stable and/or non-hygroscopic salts. Further, also salts may be chosen that provide a co-precipitate product that matches the lattice of an outer layer of the QD. Especially, it may be possible to choose a co-precipitation of a salt that is identical to the outer layer material of the QD. The quantum dots, or more precisely their outer layer, may function as nucleation layer on which the precipitation salt grows which leads to precipitation.

The salts that are chosen provide in the starting liquid, especially water, form (in the starting liquid) a precipitation salt (i.e. the inorganic matrix in which the QD (with inorganic ligands) is embedded). In other words, two or more soluble salts are chosen that will form a precipitation in the starting liquid. Hence, the two or more salts that are applied in the co-precipitation process form a salt that is relatively badly soluble in the starting liquid (even though the individual salts may solve very well in the first liquid). Hence, the phrase "precipitating in a co-precipitation process an inorganic salt comprising precipitated material from the starting liquid" especially indicates that when the coprecipitation starts, the starting liquid comprises two or more salts that can coprecipitate as well as the quantum dots (with inorganic capping agent). The salt thus formed may also be a mixed salt (or mixed crystal).

Especially, solubility of the precipitation salt is lower than 0.1 mol/l, even more especially lower than 0.01 mol/l, even more especially lower than 0.001 mol/l, yet even more especially less than 0.0001 mol/l, in water at room temperature. This also implies that the precipitation salt or inorganic matrix will in general not be chosen from the group of salts like LiCl, NaCl, KCl, LiBr, NaBr, KBr, LiI, NaI, KI, $Li_2SO_4$, $Na_2SO_4$, $K_2SO_4$, $NaNO_3$, $Na_3PO_4$, $MgCl_2$, $MgBr_2$, $CaCl_2$, $CaBr_2$, $BaCl_2$, $Sr(NO_3)_2$, $Ba(NO_3)_2$, $Al(NO_3)_3$, $AlCl_3$, $SrCl_2$, $ZnCl_2$, $SnCl_2$, $CdCl_2$, potassium sodium tartrate, etc.

As mentioned above, the solubility of the two or more salts that are used to form the co-precipitated inorganic salt (matrix) may be good, and may especially be at least 0.1 mol/l, even more especially at least 0.5 mol/l, such as at least 1 mol/l. An example of well soluble salts that form a precipitate in water are e.g. zinc chloride and sodium sulfide, that precipitate in water into zinc sulfide.

The starting liquid is especially an aqueous liquid, such as a liquid comprising at least 50% water, like at least 95% water, or substantially only water. However, also other liquids may be used as starting liquid, such as especially other polar liquids, such as DMSO (dimethyl sulfoxide), DMF (dimethyl formamide), formamide, methanol, ethanol, etc. (see further polar solvents also mentioned below). Good results were e.g. obtained with formamide. Of course, also combinations of two or more (polar) liquids (optionally including water), may be applied (as starting liquid). Hence, in an embodiment the starting liquid is substantially water free. In such embodiment, the coprecipitation is especially also executed in a substantially water free environment, such as in an inert atmosphere. Examples of inert atmosphere may be $N_2$, Ar, He, etc., which may e.g. be applied in a glove box.

Further, due to the substantial absence of organic material, such as less than 1 wt. % relative to the total weight of the luminescent material, especially less than 0.1 wt. %, the stability of the luminescent material under severe optical conditions may be very good. Hence, an all-inorganic luminescent material may be provided with high quantum efficiency and high stability. With the present invention, for the first time an all-inorganic micro (particulate) luminescent material based on quantum dots is provided, that may be efficient and that may be stable against water and/or oxygen. The quantum dots appear to be well shielded, whereas quantum efficiency is not (substantially) affected by the encapsulation method as described herein.

The quantum dots with inorganic ligands may be generated before executing above mentioned method. Hence, in a further embodiment, the method comprises: (i) providing luminescent quantum dots with an organic capping agent and providing in an exchange process the luminescent quantum dots with an inorganic capping agent in the starting liquid (followed by (ii) precipitating in a co-precipitation process an inorganic salt comprising precipitated material from the starting liquid; (iii) separating in a separation process the precipitated material from the starting liquid and providing said (particulate) luminescent material). Hence, one may start with organic ligands on the QDs, but these are exchanged for inorganic ligands in the exchange process. In such exchange process the quantum dots, which are capped with organic ligands, are subjected to a treatment wherein the organic capping agents ("ligands") are replaced by inorganic ligands. Hence, the quantum dots with inorganic ligands may be obtainable by a method comprising providing luminescent quantum dots with an organic capping agent and providing in an exchange process the luminescent quantum dots with an inorganic capping agent (in the starting liquid).

Such exchange process may especially comprise a phase transfer process. In such phase transfer process, the QDs with organic ligands are dissolved in an (apolar) organic liquid (such as heptane or toluene) and the inorganic ligands are dissolved in another liquid that is (substantially) not miscible with the organic liquid. The other liquid may for instance be water or another polar solvent. Phase transfer processed are known in the art, e.g. in the field of catalysis. Examples of polar solvents are e.g. ethyl acetate, tetrahydrofuran (THF), dichloromethane, acetone, acetonitrile (MeCN), dimethylformamide (DMF), dimethyl sulfoxide (DMSO), acetic acid, n-butanol, isopropanol, n-propanol, ethanol, methanol, formic acid, formamide (also known as methanamide), and water. Combinations of two or more polar solvents may also be applied (see also above).

Hence, the exchange is typically done via a phase transfer process: the original qdots in their organic solvent are combined with the inorganic ligand which is dissolved in some polar solvent (e.g. water, formamide) resulting in a 2-phase system. This system is then thoroughly mixed (stirred, shaken, sonicated, etc.) for some time, during which the original organic ligands are replaced by the inorganic ligands and the qdots migrate to the polar phase. The original ligand remains in the organic phase and may e.g. be removed by washing with an organic solvent (or another separation process). The inorganic-ligand-exchanged qdots are e.g. precipitated by adding a polar non-solvent (e.g. acetonitrile or ethanol) and separated from the liquid, e.g. by centrifugation. The liquid added is thus especially a liquid that facilitates the precipitation of the inorganic-ligand-exchanged qdots. After discarding the supernatant with the excess of inorganic ligand, the qdots may be redispersed in the polar solvent of choice (e.g. water). This latter liquid may be used as (or may be the basis of) the first liquid.

In this way, the luminescent quantum dots with inorganic capping agents in the starting liquid can be provided. The starting liquid may especially be water or another polar solvent. However, other solvents are also possible. The choice of the liquid may depend upon the desired salt that is to be co-precipitated. The starting liquid may also be a combination of liquids. A function of the starting liquid is to provide a liquid wherein the quantum dots with inorganic ligands are well dispersed.

As indicated above, when the luminescent quantum dots with inorganic capping ligands is provided, the precipitation process may be started. With two or more salts that are (individually) soluble in the starting liquid, but form together a badly soluble salt, precipitated material will be formed. Hence, the method of the invention also includes precipitating in a co-precipitation process an inorganic salt comprising precipitated material from the starting liquid. The precipitated material comprises the quantum dots hosted by the co-precipitated inorganic salt. Hence, for the co-precipitation, at least two salts may be used. One or more of these salts may have an element in common with the outer layer of the quantum dots (see also below). With the co-precipitation, a substantial part of all quantum dots may precipitate. Hence, the phrase "wherein the precipitated material comprises said quantum dots" does not imply that all the quantum dots in the starting liquid are comprised by the precipitated material. The precipitated material may comprise beads of quantum dots enclosed by the precipitated salt. Hence, the inorganic salt matrix hosts the quantum dot. The precipitated material may comprise nanospheres of about 30-60 nm in diameter. These nanospheres may host a single quantum dot.

As already indicated above, it appears beneficial when there is chemical or physical similarity between the outer layer (see also below) of the quantum dots and the matrix in which the quantum dots are hosted, i.e. the co-precipitated salt. For instance, especially the luminescent quantum dots have an outer layer, wherein in the co-precipitation process two or more salts ($M_1$-$A_1$); $M_2$-$A_2$) are applied, wherein at least one of the salts and the outer layer have an element in common. Here, $M_1$ symbolizes the one or more cations of a first salt, $M_2$ symbolized the one or more cations of the second salt, $A_1$ indicates the one or more anions of the first salt and $A_2$ indicates the one or more anions of the second salt. For instance, assuming a zinc sulfide coating on the quantum dot (i.e. a ZnS outer layer), a $M_1$ cation may be zinc and an $A_2$ anion may be sulfide, such as the combination of zinc chloride and sodium sulfide. Both may independently solve well in water, but when combined, zinc sulfide (co-) precipitates. When such co-precipitation is done in the presence of dispersed quantum dots, a precipitation is formed that includes quantum dots. A mechanism may be that on the outer layer of the quantum dots the co-precipitate formation starts, leading to particles that precipitate. Co-precipitation may for instance be facilitated by increasing or decreasing the temperature, dependent upon the type of co-precipitation. Further, co-precipitation may also be facilitated by adding a non-solvent, etc. the co-precipitated salt may e.g. be symbolized by $M_1$-$A_2$ or $M_2$-$A_1$. The notation $M_1$-$A_1$ is chosen to include all kind of cation-anion combinations. The independent starting salts $M_1$-$A_1$ and $M_2$-$A_2$ are independently well solvable in the first liquid, i.e. the starting salts and the starting liquid are chosen in such a way that the salts independently are well soluble, such as at least 0.05 g/l at RT, especially at least 0.1 g/l, even more especially at least 1 g/l, even more especially at least 5 g/l, yet even more especially at least 10 g/l at RT. The solubility of $Na_2S$ e.g. is about 47.5 gain water at RT.

In yet a further embodiment, in the method one or more of the following applies (i) one or more of the at least two salts that are used for the co-precipitation and the outer layer have an element in common, and (ii) the inorganic capping agent and the inorganic salt matrix have an element in common.

Hence, the precipitated salt and the outer layer may have an element in common. Especially, they may have a metal element in common. However, they may also have a group Va (group 15) or a group VIa (group 16) element in common. In the example of a ZnS precipitated salt on an outer layer of ZnS, the precipitated salt and the outer layer have both a metal element (Zn) and a group VIa element (S) in common. In addition to or instead of one or more elements in common, also precipitation salts are of interest which have a lattice match with the outer layer of the QDs.

As indicated above, the starting liquid may also be a combination of liquids. When such above indicated non-solvent is added to improve or speed up co-precipitation, this non-solvent is also comprised by the first liquid.

In a specific embodiment, the luminescent quantum dots have an outer layer, especially comprising ZnS, the inorganic capping agents comprise one or more of $S^{2-}$, $HS^-$, $SnS_4^{4-}$, and $Sn_2S_6^{4-}$, and the at least two salts especially comprise a first zinc salt and a second non-zinc salt, wherein the first zinc salt comprises a zinc cation and wherein the second non-zinc salt comprises an anion, and wherein the zinc cation and the anion form an insoluble salt in the starting liquid. In such embodiment, when the first liquid is water, a zinc sulfide (ZnS; zinc blende) co-precipitated may be formed enclosing the quantum dots. The term "non-zinc salt" refers to a salt not comprising zinc.

The invention is however not limited to the above indicated ligands. Other ligands that may be used may for instance be selected from the group consisting of $As_3^{3-}$, $As_4^{2-}$, $As_5^{3-}$, $As_7^{3-}$, $As_{11}^{3-}$, $AsS_3^{3-}$, $As_2Se_6^{3-}$, $As_2Te_6^{3-}$, $As_{10}Te_3^{2-}$, $Au_2Te_4^{2-}$, $Au_3Te_4^{3-}$, $Bi_3^{3-}$, $Bi_4^{2-}$, $Bi_5^{3-}$, $GaTe_2^{2-}$, $Ge_9^{2-}$, $Ge_9^{4-}$, $Ge_2S_6^{4-}$, $HgSe_2^{2-}$, $Hg_3Se_4^{2-}$, $In_2Se_4^{2-}$, $In_2Te_4^{2-}$, $Ni_5Sb_{17}^{4-}$, $Pb_5^{2-}$, $Pb_7^{4-}$, $Pb_9^{4-}$, $Pb_2Sb_2^{2-}$, $Sb_3^{3-}$, $Sb_4^{2-}$, $Sb_7^{3-}$, $SbSe_4^{3-}$, $SbSe_4^{5-}$, $SbTe_4^{5-}$, $Sb_2Se_3^{-}$, $Sb_2Te_5^{4-}$, $Sb_2Te_7^{4-}$, $Sb_4Te_4^{4-}$, $Sb_9Te_6^{3-}$, $Se_2^{2-}$, $Se_3^{2-}$, $Se_4^{2-}$, $Se_{5,6}^{2-}$, $Se_6^{2-}$, $Sn_5^{2-}$, $Sn_9^{3-}$, $Sn_9^{4-}$, $SnS_4^{4-}$, $SnSe_4^{4-}$, $SnTe_4^{4-}$, $SnS_4Mn_2^{5-}$, $SnS_2S_6^{4-}$, $Sn_2Se_6^{4-}$, $Sn_2Te_6^{4-}$, $Sn_2Bi_2^{2-}$, $Sn_8Sb^{3-}$, $Te_2^{2-}$, $Te_3^{2-}$, $Te_4^{2-}$, $Tl_2Te_2^{2-}$, $TlSn_3^{3-}$, $TlSn_8^{5-}$, $TlSn_9^{3-}$, $TlTe_2^{2-}$, $SnS_4Mn_2^{5-}$, etc. Further, ligands that may be used may for instance also be selected from the group consisting of $ZnCl_4^{2-}$ (tetrachlorozincate), $Zn(OH)_4^{2-}$ (tetrahydroxozincate) and $Zn(NO_3)_4^{2}$ (tetranitratozincate). Ligands that may be used may for instance also be selected from the group consisting $SnO_3^-$, $SnO_3^{2-}$, and $SnO_4^{4-}$. Yet further ligands that may be used may for instance be selected from the group consisting of phosphor based groups (ligands), such as $PO_3^{3-}$, $PO_4^{3-}$, $POCl_3$, $P_2O_7^{4-}$, $P_3O_{10}^{5-}$, and indium based groups (ligands). Optionally, the ligands that may be used may for instance also be selected from the group consisting of cadmium based groups (ligands), such as $Cd(OH)_4^{2-}$. However, also $OH^-$ may be applied (as inorganic capping ligand). Of course, combination of two or more (inorganic capping) ligands may be applied. Hence, composite anions comprising one or more of P, Cd, Zn, Sn, S, As, Tl, Sb, Se, Te, In, etc., such as e.g. mentioned above (like $Zn(OH)_4^{2-}$, $SnO_3^-$, or $PO_3^{3-}$, etc.) may be of relevance. However, also cations may be used as ligands. Further, not only charged ligands or capping elements can be used. Also neutral capping elements may be applied. The term "capping ligand" or "capping element" may also refer to a plurality of different capping ligands. The inorganic capping ligands herein may also be defined as "coordinating ion" or "graft" or "grafting ligand". Hence, the term "a capping ligand" is used to indicate that there is at least one type of capping ligands (associated with the outer layer).

Hence, the method of the invention may also include replacing in an exchange process an organic capping agent with the inorganic capping agent, wherein in an embodiment the inorganic capping ligand is selected from the group consisting of $S^{2-}$, $HS^-$, $SnS_4^{4-}$, $Sn_2S_6^{4-}$, $ZnCl_4^{2-}$, $Zn(OH)_4^{2-}$, and $Zn(NO_3)_4^{2-}$, or wherein in an embodiment the inorganic capping ligand is selected from the group consisting $SnO_3^-$, $SnO_3^{2-}$, and $SnO_4^{4-}$, or $OH^-$, or selected of any one of the (other) above indicated capping ligands. Hence, in an embodiment the method of the invention may also include replacing in an exchange process an organic capping agent with $OH^-$. Combinations of two or more different (inorganic) capping ligands may also be applied. In a specific embodiment, the inorganic capping agent comprise one or more of $S^{2-}$, $HS^-$, $SnS_4^{4-}$, $Sn_2S_6^{4-}$, $ZnCl_4^{2-}$, $Zn(OH)_4^{2-}$, and $Zn(NO_3)_4^{2-}$, especially when the outer layer comprises a zinc compound or a sulfide compound, such as especially ZnS.

Especially, the inorganic ligands and the outer layer of the have an element in common (see also above). Further, especially the outer layer may comprise ZnS, CdS, ZnO, ZnSe or ZnP. Hence, assuming the outer layer to includes ZnS, CdS, ZnO, ZnSe or ZnP, the ligand or capping agent may include one or more of Zn and/or S, Cd and/or S, Zn and/or O (especially Zn), Zn and/or Se, or Zn and/or P, respectively. Likewise, especially the inorganic ligands and the precipitated salt have an element in common, such as a metal element and/or a group Va element and/or a group VIa element.

Especially, the inorganic ligand and the precipitated salt (or the salt to be precipitated) are chosen to provide and enclosure of the quantum dot which may have no or a low lattice mismatch with the outer layer of the quantum dot (see also above), especially after sintering or annealing (see below).

After co-precipitation, in a separation process the precipitated material may be separated from the starting liquid and said (particulate) luminescent material may be provided. This may be done with processes known in the art like filtering, decanting, centrifuging (and decanting), etc. Further, the thus obtained material may be washed and/or dried. In general, a drying process is included. The thus obtained material may be treated further, for instance to get at more homogeneous particle size or to get a larger or smaller particle size. Hence, drying, pressing, grinding, sieving, sintering, annealing etc. may be part of a further processing. Therefore, in a specific embodiment, subsequent to the separation process the precipitated material is further subjected to a process for providing (particulate) luminescent material with especially a number averaged particle size in the range of 0.5-40 µm. The presently described method to provide QDs in a matrix (host matrix) provides a solid material that may easily be processed, in contrast to quantum dots in liquid systems.

Sintering and annealing may improve the stability because crystallinity (of especially the precipitated) salt may be improved. Also the connection between the qdots and the surrounding precipitated salt may hereby be improved. After sintering and/or annealing, the material may be further process to provide providing (particulate) luminescent material with especially a number averaged particle size in the range of 0.5-40 µm. The particle size may e.g. be evaluated with SEM or TEM, or optionally with other techniques known in the art like laser scattering. In a specific embodiment, annealing may be done in a temperature range of at least 150-400° C., such as especially 200-350° C. Further, (such) annealing may especially be done in an inert or ambient air. Good results were surprisingly obtained in ambient air, especially up to a temperature in the range of 250-350° C. Further, the material after co-precipitation (and separation) may be compacted, such as amongst others by annealing and/or pressing, tableting, etc., e.g. to obtain the above indicated particulate material.

Of course, the method of the invention may also be applied to provide a ((precipitated) salt) matrix with different types of quantum dots. For instance, this may be achieved when the first liquid comprises different types of quantum dots. Hence, in an embodiment the invention also provides a method wherein at least two different types of luminescent quantum dots are provided, wherein the different types of luminescent quantum dots have different emission spectra upon excitation with blue or UV light.

As indicated above, the matrix comprises the co-precipitated salt with the QD('s) embedded therein. The matrix may also be a combination of different matrix salts (that are co-precipitated together).

In yet a further embodiment, the luminescent material is further enclosed in a host material (secondary matrix), to provide e.g. a layer (such as a film) or a body. This host material may thus e.g. comprise a plurality of particles of the particulate luminescent material. This host material may especially be a transmissive host material, and may be of inorganic or organic character. For instance, the host material may comprise one or more materials selected from the group consisting of PE (polyethylene), PP (polypropylene), PEN (polyethylene napthalate), PC (polycarbonate), polymethylacrylate (PMA), polymethylmethacrylate (PMMA) (Plexiglas or Perspex), cellulose acetate butyrate (CAB), polyvinylchloride (PVC), polyethylene terephthalate (PET), (PETG) (glycol modified polyethylene terephthalate), PDMS (polydimethylsiloxane), and COC (cyclo olefin copolymer). However, in another embodiment waveguide may comprise an inorganic material. Preferred inorganic materials are selected from the group consisting of glasses, (fused) quartz, transmissive ceramic materials, and silicones. Also hybrid materials, comprising both inorganic and organic parts may be applied. Especially preferred are PMMA, transparent PC, silicone, or glass as material for the waveguide. Especially, silicone may be of interest, but also PDMS and polysilsesquioxane.

Hence, the (particulate) luminescent material may be embedded in such host material. In an embodiment, a LED dome comprises such host material (secondary matrix), with the (particulate) luminescent material embedded therein. Hence, the invention also provides a wavelength converter element comprising a host material with the (particulate) luminescent material, as defined herein or obtainable by the method as defined herein, embedded therein.

The host material per se, the precipitated salt per se, and the ligands per se, as described herein, will in general be non-luminescent under blue and/or UV irradiation. However, in other embodiments, one or more of these may also be luminescent under blue and/or UV radiation. The quantum dots contained therein however may provide the (desired) luminescence.

Hence, the invention also provides a wavelength converter element comprising a host material with the (particulate) luminescent material embedded therein. Further, the invention also provides a method as defined herein for the production of luminescent material, wherein the method further comprises enclosing the luminescent material in the host material (to provide a wavelength converter element). As indicated above, this wavelength converter element may e.g. be (configured as) a layer, such as a film, especially a polymeric layer, or a body, such as a dome. Alternatively or additionally, the wavelength converter may also be (configured as) a lens or reflector. Hence, for instance once the powder of QDs in the precipitated salt, such as e.g. ZnS, one can easily mix that powder into another, secondary matrix such as silicones, e.g. to dispense it onto an LED (die). In other words, another benefit, next to the stability, of this approach is that an improved processibility of the QDs is provided by making it a micropowder, instead of a nanopowder. It may be treated as any other conventional phosphor. Hence, one of the products herein described is a luminescent material based on quantum dots which are encapsulated in an inorganic salt. Such particulate luminescent material can be mixed in conventional LED matrix materials such as silicones. This means the QD material is much easier to process, and similarly processable as conventional phosphors. The powder may e.g. be mixed with e.g. YAG:Ce powder to make processing even easier. However, also other (conventional) phosphors may be conceivable. Hence, the new luminescent material can be used and processed as conventional particulate luminescent material, without the need for additional sealing In yet a further aspect, the invention provides a (particulate) luminescent material based on quantum dots, wherein the quantum dots have inorganic capping agents, wherein the luminescent material comprises particles having an inorganic salt matrix hosting the quantum dots with inorganic capping agents. Especially, the invention also provides a (particulate) luminescent material based on quantum dots, wherein the quantum dots have inorganic capping agents, wherein the (particulate) luminescent material comprises particles having an inorganic salt matrix hosting the quantum dots with inorganic capping agents (wherein the luminescent quantum dots have an outer layer), and wherein especially the inorganic salt of the inorganic salt matrix and an (the) outer layer (of the quantum dots) have a cation in common. As indicated above, especially the luminescent quantum dots have an outer layer comprising ZnS, wherein the inorganic capping agents comprise one or more of $S^{2-}$, $HS^-$, $SnS_4^{4-}$, and $Sn_2S_6^{4-}$, wherein the inorganic salt of the inorganic salt matrix comprises ZnS.

The luminescent material thus obtained may be particulate or may be made particulate (with methods known in the art, such as including, but not limited to, grinding (see also above)). In further embodiments, the luminescent quantum dots are dispersed within particles of the luminescent material. Further, especially the particles may have a number averaged particle size in the range of 0.5-40 µm, such as especially 1-30 µm, even more especially 1.5-25 µm. The particles may be conglomerates of smaller particles, such as in the order of about 50 nm (see also above). The (particulate) luminescent material may comprise in the range of 0.001-25 wt. %, especially 0.1-5 wt. %, quantum dots relative to the total weight of the (particulate) luminescent material. With the co-precipitation process, such particles may be relatively easily made.

Especially, the luminescent material may be produced by the method as described herein. Hence, in a further embodiment the (particulate) luminescent material is obtainable by the method as defined herein.

In yet a further aspect, the invention also provides a lighting device comprising a light source and a (particulate) luminescent material as defined in herein, wherein the light source is configured to illuminate the (particulate) luminescent material. Here, the QDs, are applied as wavelength converter nanoparticles. The luminescent material is thus especially arranged as wavelength converter, configured to convert at least part of the light source light into luminescent material light.

In further embodiments, the quantum dots are of the core-shell type, especially with a shell comprising ZnS. Further, especially the inorganic salt matrix (thus) hosting the quantum dots with inorganic capping agents also comprises ZnS. Further, as indicated above, especially the capping agents comprise one or more of $S^{2-}$, $HS^-$, $SnS_4^{4-}$, and $Sn_2S_6^{4-}$.

The term "quantum dots" or "luminescent quantum dots" may also refer to a combination of different type of quantum dots, i.e. quantum dots that have different spectral properties. The QDs are herein also indicated as "wavelength converter nanoparticles". The term "quantum dots" especially refer to quantum dots that luminesce in one or more of the UV, visible and IR (upon excitation with suitable radiation, such as UV radiation).

The quantum dots or luminescent nanoparticles, which are herein indicated as wavelength converter nanoparticles, may for instance comprise group II-VI compound semiconductor quantum dots selected from the group consisting of (core-shell quantum dots, with the core selected from the group consisting of) CdS, CdSe, CdTe, ZnS, ZnSe, ZnTe, HgS, HgSe, HgTe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, CdZnSeS, CdZnSeTe, CdZnSTe, CdHgSeS, CdHgSeTe, CdHgSTe, HgZnSeS, HgZnSeTe and HgZnSTe. In another embodiment, the luminescent nanoparticles may for instance be group III-V compound semiconductor quantum dots selected from the group consisting of (core-shell quantum dots, with the core selected from the group consisting of) GaN, GaP, GaAs, AlN, AlP, AlAs, InN, InP, InGaP, InAs, GaNP, GaNAs, GaPAs, AlNP, AlNAs, AlPAs, InNP, InNAs, InPAs, GaAlNP, GaAlNAs, GaAlPAs, GaInNP, GaInNAs, GaInPAs, InAlNP, InAlNAs, and InAlPAs. In yet a further embodiment, the luminescent nanoparticles may for instance be I-III-VI2 chalcopyrite-type semiconductor quantum dots selected from the group consisting of (core-shell quantum dots, with the core selected from the group consisting of) $CuInS_2$, $CuInSe_2$, $CuGaS_2$, $CuGaSe_2$, $AgInS_2$, $AgInSe_2$, $AgGaS_2$, and $AgGaSe_2$. In yet a further embodiment, the luminescent nanoparticles may for instance be (core-shell quantum dots, with the core selected from the group consisting of) I-V-VI2 semiconductor quantum dots, such as selected from the group consisting of (core-shell quantum dots, with the core selected from the group consisting of) $LiAsSe_2$, $NaAsSe_2$ and $KAsSe_2$. In yet a further embodiment, the luminescent nanoparticles may for instance be core-shell quantum dots, with the core selected from the group consisting of) group (IV-VI compound semiconductor nano crystals such as SbTe. In a specific embodiment, the luminescent nanoparticles are selected from the group consisting of (core-shell quantum dots, with the core selected from the group consisting of) InP, CuInS$_2$, CuInSe$_2$, CdTe, CdSe, CdSeTe, AgInS$_2$ and AgInSe$_2$. In yet a further embodiment, the luminescent nanoparticles may for instance be one of the group (of core-shell quantum dots, with the core selected from the group consisting of) II-VI, III-V, I-III-V and IV-VI compound semiconductor nano crystals selected from the materials described above with inside dopants such as ZnSe:Mn, ZnS:Mn. The dopant elements could be selected from Mn, Ag, Zn, Eu, S, P, Cu, Ce, Tb, Au, Pb, Tb, Sb, Sn and Tl. Herein, the luminescent nanoparticles based luminescent material may also comprise different types of QDs, such as CdSe and ZnSe:Mn.

It appears to be especially advantageous to use II-VI quantum dots. Hence, in an embodiment the semiconductor based luminescent quantum dots comprise II-VI quantum dots, especially selected from the group consisting of (core-shell quantum dots, with the core selected from the group consisting of) CdS, CdSe, CdTe, ZnS, ZnSe, ZnTe, HgS, HgSe, HgTe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, CdZnSeS, CdZnSeTe, CdZnSTe, CdHgSeS, CdHgSeTe, CdHgSTe, HgZnSeS, HgZnSeTe and HgZnSTe, even more especially selected from the group consisting of CdS, CdSe, CdSe/CdS and CdSe/CdS/ZnS.

The luminescent nanoparticles (without coating) may have dimensions in the range of about 2-50 nm, such as 2-20 nm, especially 2-10 nm, even more especially 2-5 nm; especially at least 90% of the nanoparticles have dimension in the indicated ranges, respectively, (i.e. e.g. at least 90% of the nanoparticles have dimensions in the range of 2-50 nm, or especially at least 90% of the nanoparticles have dimensions in the range of 2-5 nm). The term "dimensions" especially relate to one or more of length, width, and diameter, dependent upon the shape of the nanoparticle.

In an embodiments, the wavelength converter nanoparticles have an average particle size in a range from about 1 to about 1000 nanometers (nm), and preferably in a range from about 1 to about 100 nm. In an embodiment, nanoparticles have an average particle size in a range from about 1 to about 20 nm. In an embodiment, nanoparticles have an average particle size in a range from about 1 to about 10 nm.

Typical dots are made of binary alloys such as cadmium selenide, cadmium sulfide, indium arsenide, and indium phosphide. However, dots may also be made from ternary alloys such as cadmium selenide sulfide. These quantum dots can contain as few as 100 to 100,000 atoms within the quantum dot volume, with a diameter of 10 to 50 atoms. This corresponds to about 2 to 10 nanometers. For instance, spherical particles such as CdSe, InP, or CuInSe$_2$, with a diameter of about 3 nm may be provided. The luminescent nanoparticles (without coating) may have the shape of spherical, cube, rods, wires, disk, multi-pods, etc., with the size in one dimension of less than 10 nm. For instance, nanorods of CdSe with the length of 20 nm and a diameter of 4 nm may be provided. Hence, in an embodiment the semiconductor based luminescent quantum dots comprise core-shell quantum dots. In yet another embodiment, the semiconductor based luminescent quantum dots comprise dots-in-rods nanoparticles. A combination of different types of particles may also be applied. Here, the term "different types" may relate to different geometries as well as to different types of semiconductor luminescent material. Hence, a combination of two or more of (the above indicated) quantum dots or luminescent nano-particles may also be applied.

One example, such as derived from WO 2011/031871, of a method of manufacturing a semiconductor nanocrystal is a colloidal growth process. Colloidal growth occurs by injection an M donor and an X donor into a hot coordinating solvent. One example of a preferred method for preparing mono disperse semiconductor nanocrystals comprises pyrolysis of organometallic reagents, such as dimethyl cadmium, injected into a hot, coordinating solvent. This permits discrete nucleation and results in the controlled growth of macroscopic quantities of semiconductor nanocrystals. The injection produces a nucleus that can be grown in a controlled manner to form a semiconductor nanocrystal. The reaction mixture can be gently heated to grow and anneal the semiconductor nanocrystal. Both the average size and the size distribution of the semiconductor nanocrystals in a sample are dependent on the growth temperature. The growth temperature necessary to maintain steady growth increases with increasing average crystal size. The semiconductor nanocrystal is a member of a population of semiconductor nanocrystals. As a result of the discrete nucleation and controlled growth, the population of semiconductor nanocrystals that can be obtained has a narrow size distribution of diameters. The small size distribution of diameters can also be referred to as a size. Preferably, a mono disperse population of particles includes a population of particles wherein at least about 60% of the particles in the population fall within a specified particle size range.

In an embodiment, nanoparticles can comprise semiconductor nanocrystals including a core comprising a first semiconductor material and a shell comprising a second semiconductor material, wherein the shell is disposed over at least a portion of a surface of the core. A semiconductor nanocrystal including a core and shell is also referred to as a "core/shell" semiconductor nanocrystal. Any of the materials indicated above may especially be used as core. Therefore, the phrase "core-shell quantum dots, with the core selected from the group consisting of" is applied in some of the above lists of quantum dot materials. The term "core-shell" may also refer to "core-shell-shell", etc. . . . , including gradient alloy shell, or dots in rods, etc.

For example, the semiconductor nanocrystal can include a core having the formula MX, where M can be cadmium, zinc, magnesium, mercury, aluminum, gallium, indium, thallium, or mixtures thereof, and X can be oxygen, sulfur, selenium, tellurium, nitrogen, phosphorus, arsenic, antimony, or mixtures thereof. Examples of materials suitable for use as semiconductor nanocrystal cores include, but are not limited to, ZnO, ZnS, ZnSe, ZnTe, CdO, CdS, CdSe, CdTe, MgS, MgSe, GaAs, GaN, GaP, GaSe, GaSb, HgO, HgS, HgSe, HgTe, InAs, InN, InP, InGaP, InSb, AlAs, AlN, AlP, AlSb, TlN, TlP, TlAs, TlSb, PbO, PbS, PbSe, PbTe, Ge, Si, an alloy including any of the foregoing, and/or a mixture including any of the foregoing, including ternary and quaternary mixtures or alloys.

The shell can be a semiconductor material having a composition that is the same as or different from the composition of the core. The shell comprises an overcoat of a semiconductor material on a surface of the core semiconductor nanocrystal can include a Group IV element, a Group II-VI compound, a Group II-V compound, a Group III-VI compound, a Group III-V compound, a Group IV-VI compound, a Group I-III-VI compound, a Group II-IV-VI compound, a Group II-IV-V compound, alloys including any of the foregoing, and/or mixtures including any of the foregoing, including ternary and quaternary mixtures or alloys. Examples include, but are not limited to, ZnO, ZnS, ZnSe, ZnTe, CdO, CdS, CdSe, CdTe, MgS, MgSe, GaAs, GaN, GaP, GaSe, GaSb, HgO, HgS, HgSe, HgTe, InAs, InN, InP, InGaP, InSb, AlAs, AlN, AlP, AlSb, TlN, TlP, TlAs, TlSb, PbO, PbS, PbSe, PbTe, Ge, Si, an alloy including any of the foregoing, and/or a mixture including any of the foregoing. For example, ZnS, ZnSe or CdS overcoatings can be grown on CdSe or CdTe semiconductor nanocrystals. An overcoating process is described, for example, in U.S. Pat. No. 6,322,901. By adjusting the temperature of the reaction mixture during overcoating and monitoring the absorption spectrum of the core, over coated materials having high emission quantum efficiencies and narrow size distributions can be obtained. The overcoating may comprise one or more layers. The overcoating comprises at least one semiconductor material which is the same as or different from the composition of the core. Preferably, the overcoating has a thickness from about one to about ten monolayers. An overcoating can also have a thickness greater than ten monolayers. In an embodiment, more than one overcoating can be included on a core.

In an embodiment, the surrounding "shell" material can have a band gap greater than the band gap of the core material. In certain other embodiments, the surrounding shell material can have a band gap less than the band gap of the core material.

In an embodiment, the shell can be chosen so as to have an atomic spacing close to that of the "core" substrate. In certain other embodiments, the shell and core materials can have the same crystal structure.

Examples of semiconductor nanocrystal (core)shell materials include, without limitation: red (e.g., (CdSe)ZnS (core) shell), green (e.g., (CdZnSe)CdZnS (core)shell, etc.), and blue (e.g., (CdS)CdZnS (core)shell (see further also above for examples of specific wavelength converter nanoparticles, based on semiconductors.

In an embodiment, semiconductor nanocrystals preferably have ligands attached thereto, such as e.g. described in WO 2011/031871. In an embodiment, the ligands can be derived from the coordinating solvent used during the growth process. In an embodiment, the surface can be modified by repeated exposure to an excess of a competing coordinating group to form an overlayer.

For example, a dispersion of the capped semiconductor nanocrystal can be treated with a coordinating organic compound, such as pyridine, to produce crystallites which disperse readily in pyridine, methanol, and aromatics but no longer disperse in aliphatic solvents. Such a surface exchange process can be carried out with any compound capable of coordinating to or bonding with the outer surface of the semiconductor nanocrystal, including, for example, carboxylic acids, phosphines, thiols, amines and phosphates. The semiconductor nanocrystal can be exposed to short chain polymers which exhibit an affinity for the surface and which terminate in a moiety having an affinity for a liquid medium in which the semiconductor nanocrystal is suspended or dispersed. Such affinity improves the stability of the suspension and discourages flocculation of the semiconductor nanocrystal.

More specifically, the coordinating ligand can have the formula:

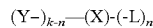

wherein k is 2, 3 4, or 5, and n is 1, 2, 3, 4 or 5 such that k-n is not less than zero; X is O, OS, O—Se, O—N, O—P, O—As, S, S=O, $SO_2$, Se, Se=O, N, N=O, P, P=O, C=O As, or As=O; each of Y and L, independently, is H, OH, aryl, heteroaryl, or a straight or branched C2-18 hydrocarbon chain optionally containing at least one double bond, at least one triple bond, or at least one double bond and one triple bond. The hydrocarbon chain can be optionally substituted with one or more C1-4 alkyl, C2-4 alkenyl, C2-4 alkynyl, C1-4 alkoxy, hydroxyl, halo, amino, nitro, cyano, C3-5 cycloalkyl, 3-5 membered heterocycloalkyl, aryl, heteroaryl, C1-4 alkylcarbonyloxy, C1-4 alkyloxycarbonyl, C1-4 alkylcarbonyl, or formyl. The hydrocarbon chain can also be optionally interrupted by —O—, —S—, —N(Ra)—, —N(Ra)—C(O)—O—, —O—C(O)—N(Ra)—, —N(Ra)—C(O)—N(Rb)—, —O—C(O)—O—, —P(Ra)—, or —P(O)(Ra)—. Each of Ra and Rb, independently, is hydrogen, alkyl, alkenyl, alkynyl, alkoxy, hydroxylalkyl, hydroxyl, or haloalkyl. An aryl group is a substituted or unsubstituted cyclic aromatic group. Examples include phenyl, benzyl, naphthyl, tolyl, anthracyl, nitrophenyl, or halophenyl. A heteroaryl group is an aryl group with one or more heteroatoms in the ring, for instance furyl, pyridyl, pyrrolyl, phenanthryl.

Further ligands may especially be one or more of oleic acid, and tri-octyl phosphine, and tri-octyl phosphine oxide. Hence, ligands may especially be selected from the group of acids, amines, phosphines, phosphine oxides and thiols.

A suitable coordinating ligand can be purchased commercially or prepared by ordinary synthetic techniques, for example, as described in J. March, Advanced Organic Chemistry. Other ligands are described in U.S. patent application Ser. No. 10/641,292 for "Stabilized Semiconductor Nanocrystals", filed 15 Aug. 2003, which issued on 9 January 2007 as U.S. Pat. No. 7,160,613, which is hereby incorporated by reference in its entirety. Other examples of ligands include benzylphosphonic acid, benzylphosphonic acid including at least one substituent group on the ring of the benzyl group, a conjugate base of such acids, and mixtures including one or more of the foregoing. In an embodiment, a ligand comprises 4-hydroxybenzylphosphonic acid, a conjugate base of the acid, or a mixture of the foregoing. In an embodiment, a ligand comprises 3,5-di-teri-butyl-4-hydroxybenzyl-phosphonic acid, a conjugate base of the acid, or a mixture of the foregoing. Additional examples of ligands that may be useful with the present invention are described in International Application No. PCT/US2008/010651, filed 12 Sep. 2008, of Breen, et al., for "Functionalized Nanoparticles And Method" and International Application No. PCT/US2009/004345, filed 28 Jul. 2009 of Breen et al., for "Nanoparticle Including Multi-Functional Ligand and Method", each of the foregoing being hereby incorporated herein by reference.

The above described organic ligands are ligands with which the QD may start, e.g. in an organic solvent, and which may be exchanged in the exchange process to inorganic ligands.

The wavelength converter or wavelength converter element (or more precisely the wavelength converter nanoparticles) is (are) radiationally coupled to the light source (or, as indicated above, a plurality of light sources). The term "radiationally coupled" especially means that the light source and the wavelength converter are associated with each other so that at least part of the radiation emitted by the light source is received by the wavelength converter (and at least partly converted into luminescence). The term "luminescence" refers to the emission which emits the wavelength converter nanoparticles emit upon excitation by the light source light of the light source. This luminescence is herein also indicated as converter light (which at least comprises visible light, see also below).

The wavelength converter will in general also be configured downstream of the light source. The terms "upstream"

and "downstream" relate to an arrangement of items or features relative to the propagation of the light from a light generating means (here the especially the light source), wherein relative to a first position within a beam of light from the light generating means, a second position in the beam of light closer to the light generating means is "upstream", and a third position within the beam of light further away from the light generating means is "downstream".

The device is especially configured to generate device light, which at least partly comprises the converter light, but which may optionally also comprise (remaining) light source light. For instance, the wavelength converter may be configured to only partly convert the light source light. In such instance, the device light may comprise converter light and light source light. However, in another embodiment the wavelength converter may also be configured to convert all the light source light.

Hence, in a specific embodiment, the lighting device is configured to provide lighting device light comprising both light source light and converter light, for instance the former being blue light, and the latter comprising yellow light, or yellow and red light, or green and red light, or green, yellow and red light, etc. In yet another specific embodiment, the lighting device is configured to provide only lighting device light comprising only converter light. This may for instance happen (especially in transmissive mode) when light source light irradiating the wavelength converter only leaves the downstream side of the wavelength converter as converted light (i.e. all light source light penetrating into the wavelength converter is absorbed by the wavelength converter).

The term "wavelength converter" may also relate to a plurality of wavelength converters. These can be arranged downstream of one another, but may also be arranged adjacent to each other (optionally also even in physical contact as directly neighboring wavelength converters). The plurality of wavelength converters may comprise in an embodiment two or more subsets which have different optical properties. For instance, one or more subsets may be configured to generate wavelength converter light with a first spectral light distribution, like green light, and one or more subsets may be configured to generate wavelength converter light with a second spectral light distribution, like red light. More than two or more subsets may be applied. When applying different subsets having different optical properties, e.g. white light may be provided and/or the color of the device light (i.e. the converter light and optional remaining light source light (remaining downstream of the wavelength converter). Especially when a plurality of light sources is applied, of which two or more subsets may be individually controlled, which are radiationally coupled with the two or more wavelength converter subsets with different optical properties, the color of the device light may be tunable. Other options to make white light are also possible (see also below).

The lighting device may be part of or may be applied in e.g. office lighting systems, household application systems, shop lighting systems, home lighting systems, accent lighting systems, spot lighting systems, theater lighting systems, fiber-optics application systems, projection systems, self-lit display systems, pixelated display systems, segmented display systems, warning sign systems, medical lighting application systems, indicator sign systems, decorative lighting systems, portable systems, automotive applications, green house lighting systems, horticulture lighting, or LCD backlighting.

As indicated above, the lighting unit may be used as backlighting unit in an LCD display device. Hence, the invention provides also a LCD display device comprising the lighting unit as defined herein, configured as backlighting unit. The invention also provides in a further aspect a liquid crystal display device comprising a back lighting unit, wherein the back lighting unit comprises one or more lighting devices as defined herein.

Preferably, the light source is a light source that during operation emits (light source light) at least light at a wavelength selected from the range of 200-490 nm, especially a light source that during operation emits at least light at wavelength selected from the range of 400-490 nm, even more especially in the range of 440-490 nm. This light may partially be used by the wavelength converter nanoparticles (see further also below). Hence, in a specific embodiment, the light source is configured to generate blue light.

In a specific embodiment, the light source comprises a solid state LED light source (such as a LED or laser diode).

The term "light source" may also relate to a plurality of light sources, such as 2-20 (solid state) LED light sources. Hence, the term LED may also refer to a plurality of LEDs.

The term "substantially" herein, such as in "substantially all light" or in "substantially consists", will be understood by the person skilled in the art. The term "substantially" may also include embodiments with "entirely", "completely", "all", etc. Hence, in embodiments the adjective substantially may also be removed. Where applicable, the term "substantially" may also relate to 90% or higher, such as 95% or higher, especially 99% or higher, even more especially 99.5% or higher, including 100%. The term "comprise" includes also embodiments wherein the term "comprises" means "consists of". The term "and/or" especially relates to one or more of the items mentioned before and after "and/or". For instance, a phrase "item 1 and/or item 2" and similar phrases may relate to one or more of item 1 and item 2. The term "comprising" may in an embodiment refer to "consisting of" but may in another embodiment also refer to "containing at least the defined species and optionally one or more other species".

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

The devices herein are amongst others described during operation. As will be clear to the person skilled in the art, the invention is not limited to methods of operation or devices in operation.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. Use of the verb "to comprise" and its conjugations does not exclude the presence of elements or steps other than those stated in a claim. The article "a" or "an" preceding an element does not exclude the presence of a plurality of such elements. The invention may be implemented by means of hardware comprising several distinct elements. In the device claim enumerating several means, several of these means may be embodied by one and the same item of hardware. The mere fact that certain measures are recited in mutually different dependent claims does not indicate that a combination of these measures cannot be used to advantage.

The invention further applies to a device comprising one or more of the characterizing features described in the description and/or shown in the attached drawings. The invention further pertains to a method or process comprising one or more of the characterizing features described in the description and/or shown in the attached drawings.

The various aspects discussed in this patent can be combined in order to provide additional advantages. Furthermore, some of the features can form the basis for one or more divisional applications.

Especially, the invention provides in embodiments the use of an inorganic (ZnS) matrix to disperse (inorganic ligand) qdots in a simple way of preparing such a matrix, by a simple precipitation process from water-soluble precursor salts. Specific applications may e.g. be solid state lighting applications, most notably LED lamps with a high CRI.

The invention is especially described in relation to (semiconductor) quantum dots. However, the invention may also be applied in relation to other type of luminescent nanoparticles or nanocrystals. Hence, in a further aspect, the invention also provides a method for the production of luminescent material based on luminescent nanoparticles, the method comprising: (i) providing luminescent nanoparticles with an inorganic capping agent in a starting liquid; (ii) precipitating in a co-precipitation process an inorganic salt comprising precipitated material (100a) from the starting liquid; and (iii) separating in a separation process the precipitated material (100a) from the starting liquid (20) and providing said luminescent material (10).

BRIEF DESCRIPTION OF THE DRAWINGS

Embodiments of the invention will now be described, by way of example only, with reference to the accompanying schematic drawings in which corresponding reference symbols indicate corresponding parts, and in which.

The schematic drawings are not necessarily on scale.

DETAILED DESCRIPTION OF THE EMBODIMENTS

The organic ligands on the quantum dots are replaced by inorganic ligands, such as sulfide based ligands (e.g. $Sn_2S_6^{4-}$ or $S^{2-}$) or zinc based ligands (e.g. $Zn(OH)_4^{2-}$), which make them dispersible in water or other polar solvents such as DSMO or formamide. The inorganic ligands are preferably highly compatible with the ZnS shell (or other shell, or non-shell outer layer material) that is found on the majority of all modern quantum dot types. After the exchange and purification, a thick ZnS layer is deposited on those qdots by a simple precipitation procedure. Aqueous solutions of two water soluble salts ($ZnCl_2$ and $Na_2S$) are mixed, that form the insoluble ZnS in situ. The ZnS ultimately forms a matrix around the qdots, thereby forming a qdot/ZnS composite that can be applied as a generic micron-sized phosphor powder that is more stable against prevailing LED conditions while there is less or no need for additional hermetic sealing.

In addition to inorganic ligand exchanged qdots as described above, any other qdot type that is water dispersable (for example mercaptopropionic acid capped qdots or silica coated qdots) can be used as starting point for this co-precipitation method to incorporate the QDs in a second inorganic matrix.

In addition to ZnS, any other inorganic material that can be formed via the solution precipitation method (i.e. 2 or more water soluble materials that combine into 1 or more water insoluble materials).

Typically, quantum dots are obtained as zinc sulphide coated nanocrystals, surrounded by organic ligands such as oleate and dispersed into an organic solvent like toluene. The first step into creating qdots with inorganic ligand in an inorganic matrix (ILIM-qdots), is to exchange those organic ligands for inorganic ones. Typically sulphide based ions are used ($S^{2-}$, $HS^-$, $SnS_4^{4-}$, $Sn_2S_6^{4-}$) but others are also possible (e.g. $OH^-$). This exchange is schematically shown in the figure below.

Figure 1A:
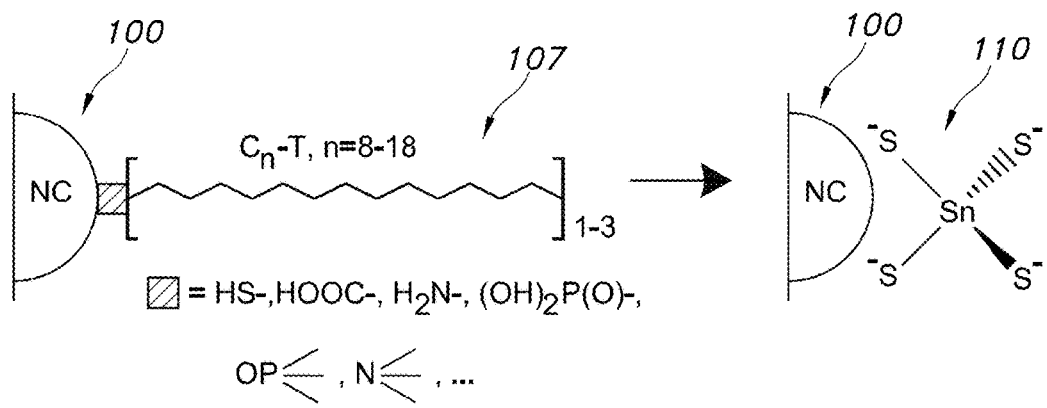
FIGS. 1a-1b schematically depict some aspects of the invention.

The ligand exchange is schematically depicted in FIG. 1a (derived from *Maksym V. Kovalenko* et al., JACS 2010, 132, 10085-10092), with ref. 100 indicating the quantum dot, ref 107 indicating the organic ligand, and ref. 110 indicating the inorganic ligand. The ligands depicted are only shown by way of example. Other ligands, organic as well as inorganic may also be chosen. In FIG. 1a, the symbol "$C_n$-T" may indicate the hydrocarbon tail. The reference NC refers to nano crystal.

Ideally, the ligand used is highly compatible with the surface of the qdots (which is in most cases ZnS), so sulphide based ligands are preferred. In addition to inorganic ligand exchanged qdots as described above (which are preferred due to their inorganic nature), any other type of water dispersable qdots can be used as starting point for the inorganic matrix incorporation as described below. For example, qdots can also be made water soluble by exchanging the aliphatic ligands by charged ligands such as mercaptopropionic acid, or aminoethanethiol.

In addition to the inorganic and organic ligand water soluble qdots, also silica coated qdots can be incorporated with the method described below. Silica coated QDs can be obtained via the so-called reverse micelle method or Stober method and has been extensively studied (Koole et al., Chem. Mater. 2008, 20, p. 2503). However, the silica layer around qdots is amorphous, and therefore a less sufficient barrier to water and air. Thus, also silica coated qdots can be incorporated in a second, micron-sized inorganic matrix by the co-precipitation method described below. The surface of the silica coated qdots may need to be pretreated in order to act as suitable nucleation seed for the second matrix attachment.

After the ligand exchange, an inorganic matrix can be applied. Ideally, the inorganic matrix applied is highly compatible with the qdot surface and the inorganic ligand(s) used, so zinc sulphide (ZnS) is preferred, but other materials are certainly possible.

Figure 1B:
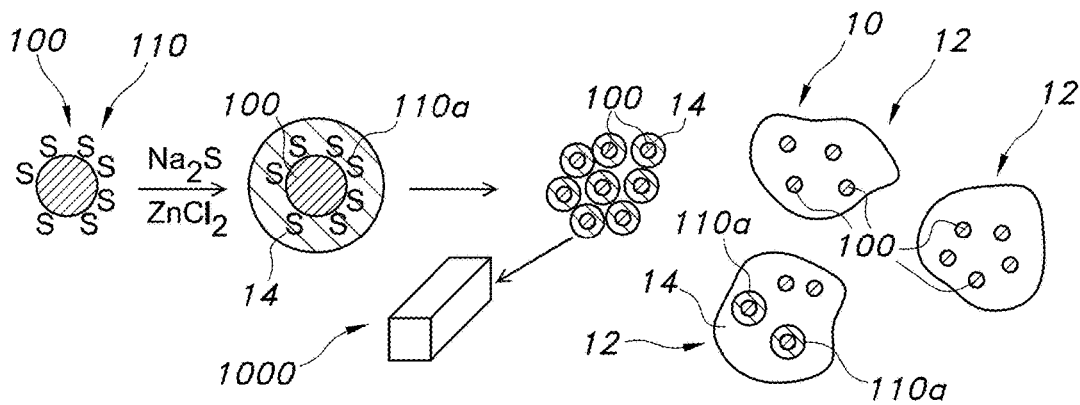

The method we apply here is using a simple precipitation approach whereby an insoluble salt (ZnS) is formed by combining two highly water-soluble salts ($Na_2S$ and $ZnCl_2$). Combining aqueous solutions of these salts will result in a swift formation of a ZnS precipitate. The combination of the other two ions should result in a soluble salt again (NaCl in this case). As the qdots are (preferably) sulphide terminated, they can act as seeds for the growth of the ZnS, thereby resulting in a relatively thick coating of the qdots with ZnS. After washing (to remove NaCl and excess reactants) and drying, a fully inorganic material containing qdots can be obtained, as is schematically shown in FIG. 1b. This figure schematically represents the formation of a thick ZnS shell around (inorganic ligand) qdots via a simple precipitation procedure. In FIG. 1b, reference 110a indicates a layer of the inorganic ligands. This layer may not be a pure layer of ligands, but there may be a gradient change of the quantum dot particle to the bulk of the matrix, with a high concentration inorganic ligands close to the QD and substantially no inorganic ligand further away from the QD. Reference 12 indicates the co-precipitated particles obtained in the process. In general, these particles may include a plurality of quantum dots. Reference 14 indicates the matrix or matrix material (i.e. the co-precipitated salt (material) wherein the QDs are dispersed. Reference 1000 indicates a luminescent layer or body comprising (particulate) luminescent material. This is herein also indicated as wavelength converter element 1000.

Figure 2A:
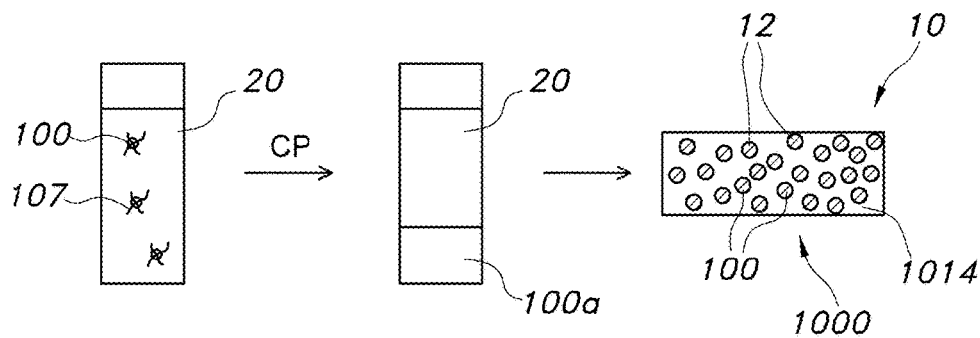
FIGS. 2a-2b schematically depict some aspects of a method for the production of the luminescent material.

FIG. 2a very schematically depicts the quantum dots 100 being dispersed via the ligands 107 in the liquid 20. After co-precipitation (CP), a layer with precipitated material is obtained. This precipitated material is indicated with reference 107. With further processing, the precipitated material may result in particulate luminescent material 10 (see FIG. 1b) or in a wavelength converter element 1000 enclosing the particular luminescent material 10 with quantum dots. The wavelength converter element may include a host material 1014, such as a silicone or PMMA, etc., which surrounds the luminescent material particles 12. Hence, the matrix material of wavelength converter element will in general be of a material that is different from the precipitated salt material.

Figure 2B:
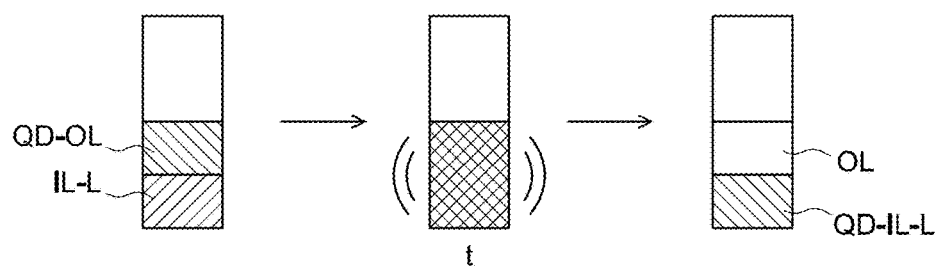

FIG. 2b schematically presents of the inorganic ligand exchange procedure with quantum dots. Here, QD refers to quantum dots, OL refers to organic liquid, IL refers to inorganic ligands, L refers to liquid (for inorganic ligands), "t" indicates time, and QD-IL-L indicates the quantum dots with inorganic ligands in the liquid. OL refers in the most right drawing/stage again to organic liquid.

Figure 3A:
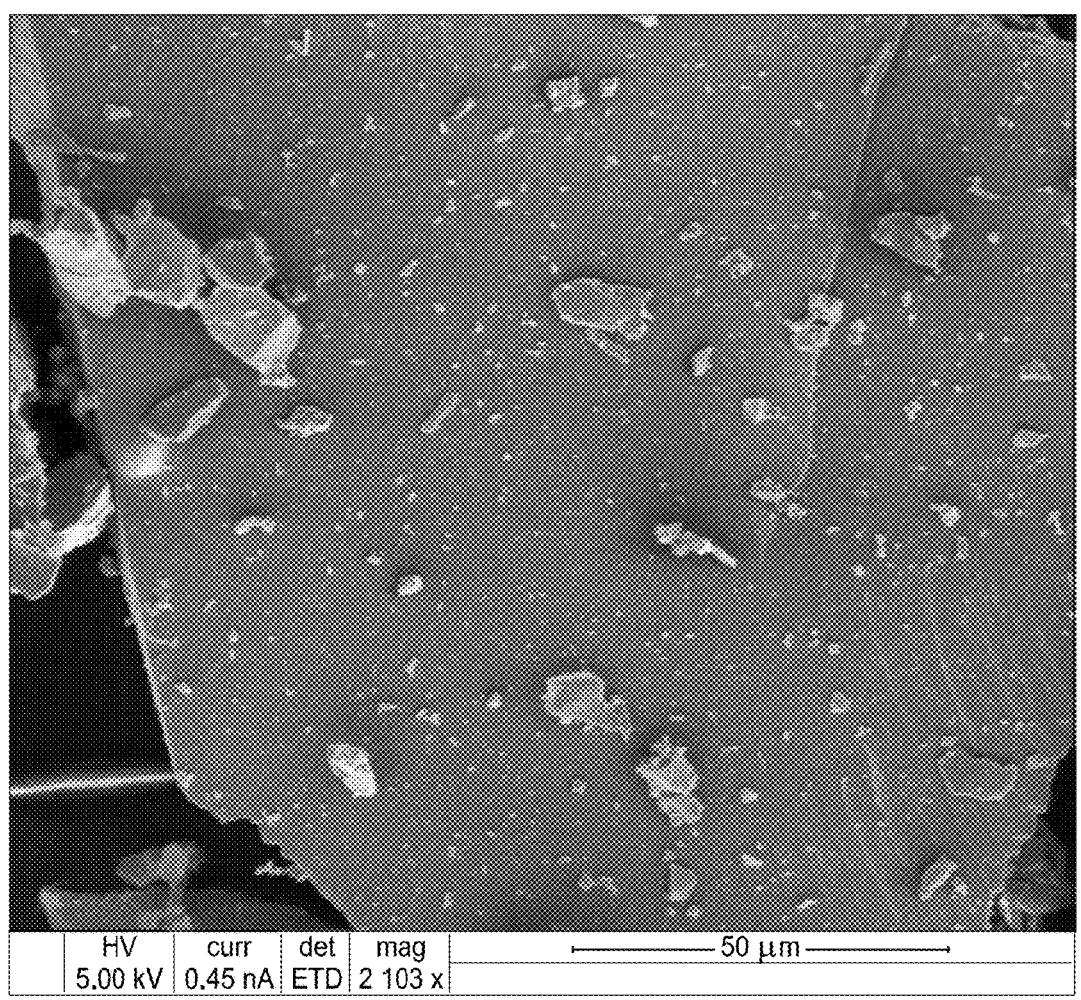
FIGS. 3a-3b show SEM pictures of the luminescent material.
Figure 3B:
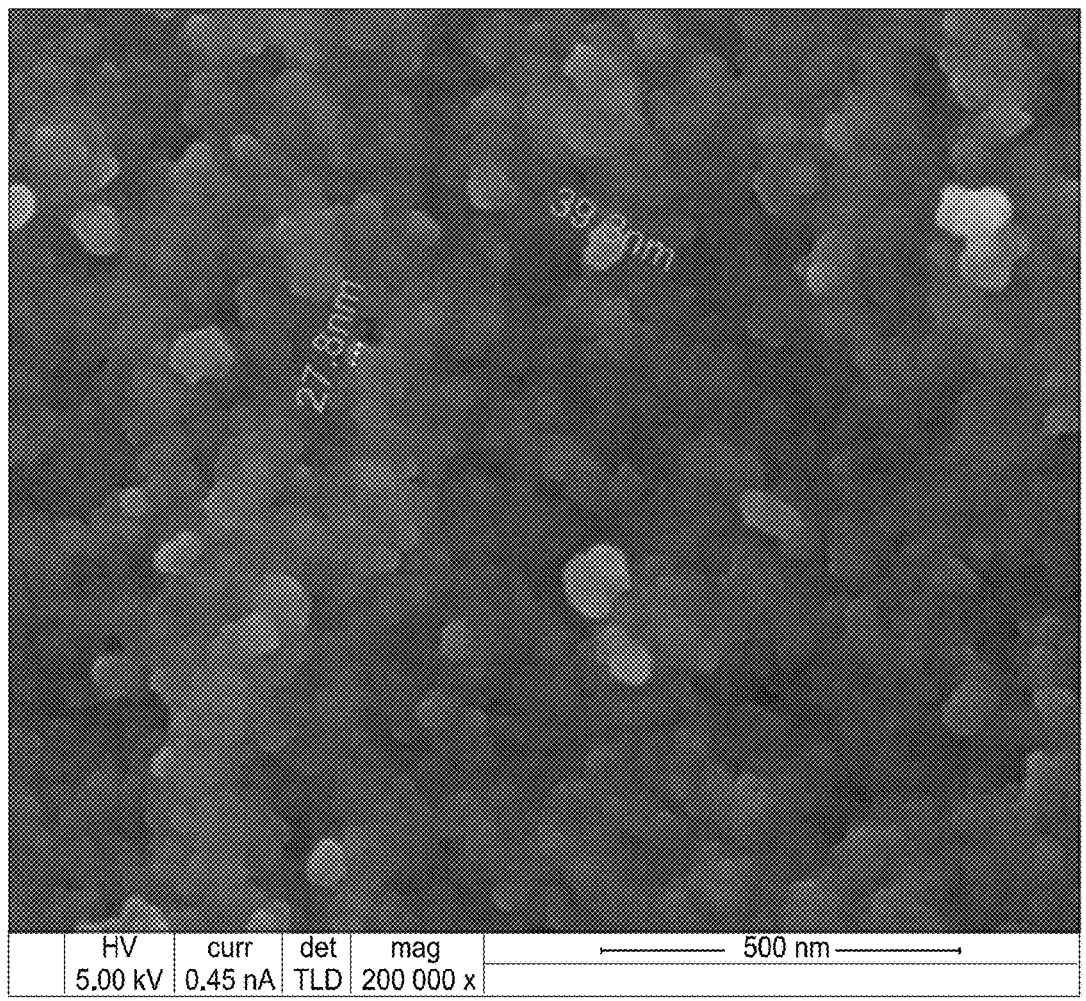

FIGS. 3a-3b are further elucidated below (and above).

Figure 4A:
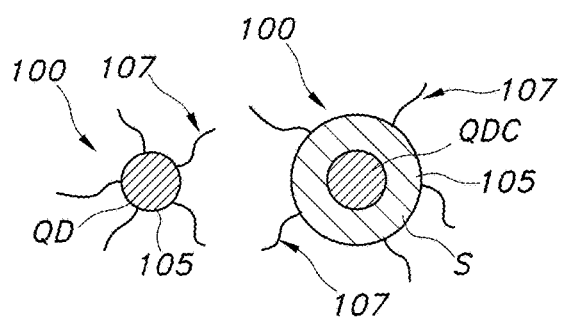
FIGS. 4a-4b schematically depict some further aspects of the invention.

FIG. 4a schematically depicts two types of quantum dots, though more types are possible (see also above), such as e.g. dot-in-rod quantum dots, which are also a type of core-shell QDs. The left QD 100 is a bare QD without shell. Here, the chemical composition of the outer layer may be substantially identical to the chemical composition of the rest of the quantum dot. The quantum dot here has organic ligands 107. The right particle is a so-called core-shell particle. The core is indicated with reference QDC and the shell, which is here also the outer layer 105, is indicated with reference S. Of course, also core-shell-shell or other type of quantum dot based particles may be applied.

Figure 4B:
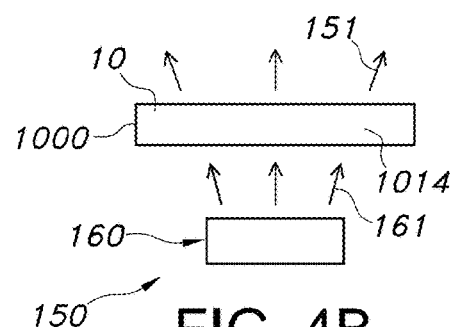

FIG. 4b schematically depicts a lighting device 150 with a light source 160, configured to generate light source light 161. This light source light 161 is at least partly received with the luminescent material 10, for instance in the form of a layer or body 1000, or comprised by such layer or body 1000. This layer or body may also be indicated as wavelength converter element (see also FIG. 2a). The luminescent material 10 is optically coupled with the light source 160. The luminescent material absorbs at least part of the light source light 161 and converts this light source light 161 into luminescent material light. The light provided by the lighting device 150 is indicated with reference 151. This lighting device light 151 may at least include the light generated by the luminescent material 10 upon said excitation with the light source light 161, but may optionally also include said light source light 161. Together, they may for instance provide white lighting unit light 151. Referring to FIGS. 2a and 4b, the invention thus also includes wavelength converter elements enclosing luminescent material particles. The luminescent particles on their turn may include a precipitated salt enclosing quantum dots. The quantum dots may include core-shell type quantum dots (or other type of quantum dots). Further, between the quantum dots and the precipitated salt material, there may be a layer this is substantially based on the inorganic ligands with which the quantum dots were stabilized in the starting liquid (before co-precipitation) of the inorganic salt.

EXAMPLES

Example 1

Commercially available quantum dots from Crystalplex (CdSe/CdS/ZnS core/shell/shell) with oleate ligands (emitting at 600 nm) were subjected to an inorganic ligand exchange by adding 0.25 mL of the qdot solution (5 mg/mL in toluene) to 1.75 mL n-heptane. The polar phase was made by 0.125 mL 1M $(NH_4)_4Sn_2S_6$ in water to 2 mL of formamide (FA). The two phases were combined and stirred vigorously for 45 minutes. The organic layer was removed, and the FA phase was washed 4 times with n-heptane (1-2 mL). Finally the clear FA layer was collected and to this was added 3 mL of acetonitrile together with a few drops (ca. 15 µL) of the inorganic ligand solution to precipitate the qdots.

After centrifugation and discarding the supernatant, the dots were redispersed into 1.3 mL 20 mM $Na_2S.9H_2O$ in water. To this dispersion was added dropwise 1.3 mL of 20 mM $ZnCl_2$ in water. A precipitate was formed that took all the qdots with it, i.e. the supernatant was optically clear and virtually colorless.

The resulting material was washed 3 times with water (3 mL) to remove NaCl, 2 times with acetone to remove the water and dried in vacuo. A highly colored brittle material was obtained that showed weak luminescence under UV light. Qdot concentration was estimated at 30 wt % which probably results in concentration quenching.

Example 2

Commercially available quantum dots (Crystalplex; CdSe/CdS/ZnS core/shell/shell) with oleate ligands (emitting at 575 nm) were subjected to an inorganic ligand exchange by adding 0.25 mL of the qdot solution (1 mg/mL in toluene) to 2 mL n-heptane. The polar phase was 2 mL of a 5 mg/mL solution of $Na_2S.9H_2O$ in formamide (FA). The two phases were combined and stirred vigorously for 30 minutes. The organic layer was removed, and the FA phase was washed 4 times with n-heptane (1-2 mL). Finally the clear FA layer was collected and to this was added 3 mL of acetonitrile to precipitate the qdots.

After centrifugation and discarding the supernatant, the dots were redispersed into 0.25 mL of the 5 mg/mL $Na_2S$ solution in FA. The dots were still slightly agglomerated at this stage. To this dispersion was added 3 mL of water and 4 mL of 0.1 M $Na_2S.9H_2O$ in water. Subsequently, 4 mL of 0.1 M $ZnCl_2$ in water was added in a dropwise fashion, and an additional 4 mL of water. A precipitate was formed, taking all the qdots with it from the dispersion.

The resulting material was washed 3 times with water (7 mL) to remove NaCl, 2 times with acetone (7 mL) to remove the water and dried in vacuo. A salmon-pink brittle solid was obtained, that showed clear emission under UV light. The Qdot concentration was calculated at 0.6 wt %. Quantum efficiency was measured to be 25% (original qdots dispersed in toluene were 80%).

The material was gently crushed and studied under a fluorescence microscope, where it showed clear emission.

The flakes of material are glassy in appearance. They were further studied with high resolution SEM (results, see FIGS. 3a/3b). The material was found to be composed of agglomerated nanospheres, 30-60 nm in diameter. No individual qdots (size ~6-8 nm) were observed, so it appears that all of them are coated with ZnS and actually inside the nanograins. Stability measurements have been performed (in ambient air) with good results. From the SEM pictures it seems that all quantum dots are embedded in beads (nanospheres), with often a single quantum dot in a single bead instead of a plurality of quantum dots in a single bead. In FIG. 3B, two dimensions of particles found are indicated: 27.8 nm and 39.3 nm.

Example 3

An aqueous solution of potassium zincate ($K_2[Zn(OH)_4]$) was made by adding 3.125 mL of a 1M $ZnCl_2$ solution to 5 mL of a 10M KOH solution (both in water). The resulting solution was diluted with water to a final concentration of 0.125M in Zn and 2M in KOH.

Commercially available quantum dots (CdSe/CdS/ZnS core/shell/shell) with oleate ligands (emitting at 575 nm) were subjected to an inorganic ligand exchange by adding 1 mL of the qdot solution (5 mg/mL in toluene) to 7 mL n-heptane. The polar phase was made by adding 1.6 mL of the 0.125M $K_2[Zn(OH)_4]$ and 2M KOH to 4.8 mL 1M KOH and 1.6 mL of $H_2O$. The resulting polar phase is 8 mL of 0.0125 M $K_2[Zn(OH)_4]$ and 1M KOH. The two phases were combined and stirred vigorously for 1 hour. The organic layer was removed, and the FA phase was washed 4 times with n-heptane (1-2 mL).

1 mL of the resulting qdot dispersion was added to 12.5 mL of an aqueous 0.1M $Na_2S$ solution. Subsequently, 12.5 mL of 0.1 M $ZnCl_2$ in water was added in a dropwise fashion, and an additional 4 mL of water. A precipitate was formed, taking all the qdots with it from the dispersion.

Figure 5:
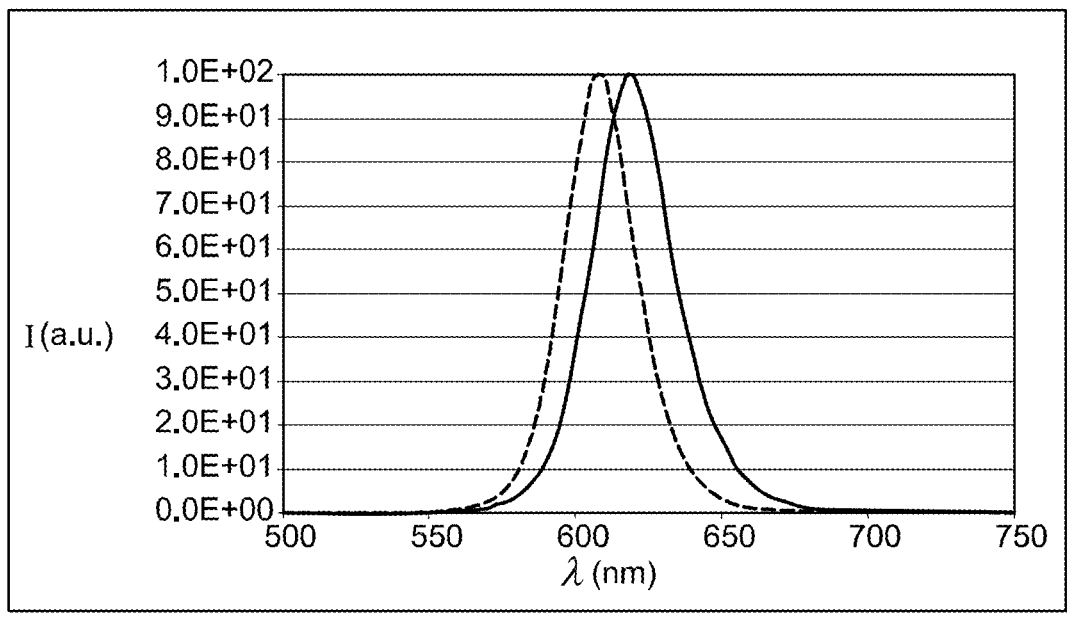
FIG. 5 depicts emission spectra of quantum dots as described herein in heptane (left curve) and the same quantum dots in a ZnS matrix.

The resulting material was washed 4 times with water (10 mL) to remove NaCl, 2 times with acetone (10 mL) to remove the water and dried in vacuo. A salmon-pink brittle solid was obtained, that showed clear emission under UV light. The Qdot concentration was calculated at 0.5 wt %. Quantum efficiency was measured to be 56% (original qdots dispersed in toluene were 80%). FIG. 5 shows the emission spectra of quantum dots as described herein in heptane (left curve) and the same quantum dots in a ZnS matrix. In the ZnS matrix the emission is shifted to lower energy. This may be due to a ligand and/or matrix effect. The emission spectrum of the quantum dots with inorganic ligands in water was also measured. That emission spectrum was substantially the same as the emission spectrum of the quantum dots in heptane.

Example 4: Zincate Exchanged Qdots in a ZnS Matrix from Water

Commercially available quantum dots from Crystalplex (CdSe/CdS/ZnS core/shell/shell) with oleate ligands (emitting at 610 nm; QE 80%) were treated with a solution of zincate ($Zn(OH)_4^{2-}$) in 1M KOH in water. Final qdot concentration was 0.625 mg/mL in this solution.

The inorganic matrix was formed by adding 1 mL of the qdot solution to 12.5 mL of a 0.1M $ZnCl_2$ solution in water, and adding to that 12.5 mL of a 0.1M $Na_2S$ solution, resulting in a precipitate of ZnS most likely also containing some $Zn(OH)_2$. The resulting dispersion was purified as above. Quantum efficiency was found to be 50%. Adding the dots to the $Na_2S$ solution first results in a lower QE (~30%), possibly due to exchange of zincate ions for sulfide ions.

Example 5: Sulfide Exchanged Qots in a ZnS Matrix—Water-Free

In this example, all processing was done under waterfree (glovebox) conditions using dry solvents and chemicals.

The inorganic ligand exchanged dots were made by treating the Crystalplex dots from example 4 with a solution of dry $Na_2S$ in dry formamide (0.1M), which had a QE of 80%. Final qdot concentration was 0.625 mg/mL in this solution after workup to remove excess ligands.

The inorganic matrix was formed by adding 1 mL of the qdot solution to 20 mL of a 0.1M $ZnCl_2$ in formamide solution, and adding to that 20 mL of a $Na_2S$ in formamide (the latter solution was freshly prepared and used within 5 hours as it is unstable). The resulting dispersion was by washing with dry formamide (3× followed by centrifugation) and acetone (2×) followed by drying in vacuo. The grinding (mortar and pestle) was performed outside the glovebox. QE was found to be 55%.

Other combinations of ligands ($S^{2-}$ vs $PO_4^{3-}$) and matrices (ZnS vs. $Zn_3(PO_4)_2$) were also tried using dry processing, and the order of the addition of the different salts to the qdots.Results are listed in the table below. Typically after ligand exchange the QE's are similar for sulfide and phosphate (~80%, on par with the dots before ligand exchange). However, the ZnS matrix give better results than the $Zn_3(PO_4)_2$ matrix, regardless of the ligand used. Order of salt addition has negligible effect.

| Ligand | Matrix (first ion added) | QE (%) |
|---|---|---|
| $S^{2-}$ | ZnS (S) | 55 |
| $S^{2-}$ | ZnS (Zn) | 54 |
| $PO_4^{3-}$ | $Zn_3(PO_4)_3(PO_4)$ | 0.6 |
| $PO_4^{3-}$ | ZnS (Zn) | 41 |
| $S^{2-}$ | $Zn_3(PO_4)_3(Zn)$ | 4 |
| $S^{2-}$ | $Zn_3(PO_4)_3(PO_4)$ | 0.5 |

Example 6: Mixed Matrix—ZnS(OH)

It is possible to make mixtures of different insoluble salts, and that was tried here. This experiment was performed in a dry glovebox environment using dry chemicals. The inorganic ligand exchanged dots were made by treating the Crystalplex dots from example 4 with a solution (15 mM) of dry $Na_3PO_4$ in dry formamide, which had a QE of 60%. Final qdot concentration was 0.625 mg/mL in this solution after workup to remove excess ligands.

The inorganic matrix was formed by adding 1 mL of the qdot solution to 20 mL of a 0.1M $ZnCl_2$ in formamide solution, and adding to that a mixture of 15 mL of a $Na_2S$ with 10 mL of a 0.1M dry KOH in formamide, resulting in a formally $ZnS_{0.75}(OH)_{0.5}$ matrix. The resulting solution was purified as detailed in example 5, using dry solvents in a glovebox environment. The grinding (mortar and pestle) was performed outside the glovebox. QE was found to be 50%.

Example 7: Mixed Matrix—ZnCdS

Another example of a mixed matrix is ZnCdS. Potentially, the Cd in the matrix may help to repair damage to (the surface of) the qdots. A test was first performed by coprecipitating a $Zn_{0.75}Cd_{0.25}S$ matrix by the required mixing of 0.1M solutions of the different salts. UV/Vis and XRD analysis showed that an alloy was formed.

This experiment was performed in a dry glovebox environment using dry chemicals. To the phosphate exchanged dots of example 6, was added 20 ml of a 0.2 M solution of $ZnCl_2$ in formamide and 3.7 mL of a 8.3 mM solution of $CdCl_2$ in formamide. To this mixture was added 21 mL of a 0.2M $Na_2S$ in formamide, resulting in a formally $Zn_{0.95}Cd_{0.05}S$ matrix. The amount of Cd was kept low to prevent the band gap of the alloy to shift too much into the visible spectrum. The resulting dispersion was processed as detailed in example 5. The quantum efficiency was about 43%.

Please note that double mixed matrices like e.g. ZnCdS (OH) etc. are options too.

Example 8: Annealing of the Inorganic Matrix Samples

Post-processing is an option, and one of the options is annealing the inorganic matrices. This was attempted for both the ZnS and $Zn_3(PO_4)_2$ matrices. It was observed by XRD analysis that up to 400° C. annealing did not have any effect on the pure matrix. With qdots in the matrix, the situation is different. For the ZnS matrix, annealing always resulted in a drop in QE above ca. 200° C., regardless of atmosphere. For the $Zn_3(PO_4)_2$ matrix, annealing in dry air or nitrogen did not have any influence upon the emission. However, annealing in ambient air resulted in an increase in emission (max. at 300° C.) and a blueshift of the emission, see the table and figure below. Sample is phosphate ligand exchanged in a zinc phosphate matrix. This exemplifies the possibility of using a post-treatment to enhance the emission and the emission wavelength after making the composite material. This was also attempted with a more concentrated composite (ca. 5% qdots in the matrix), where the results were less pronounced, indicating concentration may play a role.

| Treatment | Q.E. (%) | $\lambda_{max}$ (nm) |
| --- | --- | --- |
| untreated | 2.5 | 609 |
| 200° C., 1 h, air | 2.6 | 598 |
| 250° C., 1 h, air | 10.7 | 600 |
| 300° C., 1 h, air | 14.4 | 596 |
| 325° C., 1 h, air | 8.3 | 590 |
| 350° C., 1 h, air | 6.2 | 542 |
| 400° C., 1 h, air | — | — |

Example 9: Compacting

The the structure of the inorganic matrix tends to be very open. Hence, an interesting option is to compact the inorganic matrix composites, especially at elevated pressure and/or temperatures, such as to make dense inorganic pellets.

The invention claimed is:

1. A method comprising:
providing luminescent quantum dots with an inorganic capping agent in a starting liquid;
precipitating in a co-precipitation process an inorganic salt comprising precipitated material from the starting liquid, the precipitated material comprising said quantum dots hosted by the co-precipitated inorganic salt; and
separating in a separation process the precipitated material from the starting liquid to thereby provide a luminescent material.

2. The method according to claim 1, wherein the method comprises:
providing the luminescent quantum dots with an organic capping agent and providing in an exchange process said luminescent quantum dots with the inorganic capping agent in the starting liquid.

3. The method according to claim 2, wherein the exchange process comprises a phase transfer process.

4. The method according to claim 1, wherein subsequent to the separation process the precipitated material is further subjected to a process for providing luminescent material with a number averaged particle size in the range of 0.5-40 µm.

5. The method according to claim 1, wherein the luminescent quantum dots have an outer layer, wherein in the co-precipitation process two or more salts ($M_1$-$A_1$; $M_2$-$A_2$) are applied, wherein at least one of the salts and the outer layer have an element in common, and wherein the inorganic capping agent and one or more of the salts have an element in common.

6. The method according to claim 1, wherein the luminescent quantum dots have an outer layer comprising ZnS, wherein the inorganic capping agents comprise one or more of $S^{2-}$, $HS^-$, $SnS_4^{4-}$, $Sn_2S_6^{4-}$, $ZnCl_4^{2-}$, $Zn(OH)_4^{2-}$, and $Zn(NO_3)_4^{2-}$, and wherein the at least two salts comprise a first zinc salt and a second non-zinc salt, wherein the first zinc salt comprises a zinc cation and wherein the second non-zinc salt comprises an anion, and wherein the zinc cation and the anion form an insoluble salt in the starting liquid.

7. The method according to claim 1, wherein at least two different types of luminescent quantum dots are provided, wherein the different types of luminescent quantum dots have different emission spectra upon excitation with blue or UV light.

8. The method of claim 1, further comprising embedding the luminescent material in a wavelength converter element.

9. The method of claim 1, further comprising configuring a light source in a lighting device to illuminate the luminescent material.

10. The method according to claim 9, wherein the quantum dots are of the core-shell type, with a shell comprising ZnS, wherein the inorganic salt matrix hosting the quantum dots with inorganic capping agents also comprises ZnS, and wherein the capping agents comprise one or more of $S^{2-}$, $HS^-$, $SnS_4^{4-}$, $Sn_2S_6^{4-}$, $ZnCl_4^{2-}$, $Zn(OH)_4^{2-}$, and $Zn(NO_3)_4^{2-}$.

11. The method according to claim 9, further comprising the embedding the luminescent material in a wavelength converter element and incorporating the wavelength converter element in the lighting device.

* * * * *